United States Patent [19]

Petersson et al.

[11] Patent Number: 5,140,284

[45] Date of Patent: Aug. 18, 1992

[54] BROAD BAND FREQUENCY SYNTHESIZER FOR QUICK FREQUENCY RETUNING

[75] Inventors: Peter M. Petersson, Jarfalla; Krister I. Ripstrand, Uppsala, both of Sweden

[73] Assignee: Telefonaktiebolaget L M Ericsson, Stockholm, Sweden

[21] Appl. No.: 658,038

[22] Filed: Feb. 20, 1991

[51] Int. Cl.$^5$ .............................................. H03L 7/00
[52] U.S. Cl. .................................................... 331/25
[58] Field of Search ...................... 331/16, 18, 25, 34; 328/155

[56] References Cited

U.S. PATENT DOCUMENTS

| | | |
|---|---|---|
| 4,135,165 | 1/1979 | Coe . |
| 4,225,828 | 9/1980 | Watanabe et al. . |
| 4,504,800 | 3/1985 | Plouviez . |
| 4,528,521 | 7/1985 | Grimes . |
| 4,668,922 | 7/1985 | Crawford et al. . |
| 4,743,864 | 5/1988 | Nakagawa et al. . |
| 4,835,491 | 5/1989 | Coster ................................ 331/25 X |
| 4,847,516 | 7/1989 | Fujita et al. ......................... 331/2 X |
| 4,868,513 | 9/1989 | Piercy et al. . |
| 4,901,033 | 2/1990 | Herold et al. . |
| 4,926,141 | 5/1990 | Herold et al. . |

*Primary Examiner*—Robert J. Pascal
*Attorney, Agent, or Firm*—Burns, Doane, Swecker & Mathis

[57] ABSTRACT

In a frequency synthesizer of the type having a phase locked loop, a variable frequency divider is coupled to the output of the phase locked loop and a variable divider for dividing a reference signal is coupled to a frequency source for the frequency synthesizer. The phase lock loop also includes a variable divider for dividing the signal fed back from a voltage controlled oscillator to a phase detector. The division numbers or divisors of the variable frequency dividers are controlled such that a predetermined relationship exists among the frequency dividers. The frequency synthesizer is capable of switching reference frequencies without causing phase jumps. The reference frequency is selected depending upon the choice of a division number for the frequency divider coupled to the output of the frequency synthesizer.

9 Claims, 2 Drawing Sheets

BROAD BAND FREQUENCY SYNTHESIZER FOR QUICK FREQUENCY RETUNING

FIELD OF THE INVENTION

The present invention relates generally to frequency synthesizers of the type having a phase locked loop (PLL), and more particularly to an improved frequency synthesizer having a switchable reference frequency at the input of the PLL and a variable divider at the output of the PLL.

BACKGROUND OF THE INVENTION

A phase locked loop is a well known circuit which typically includes a phase detector, a filter, and a voltage controlled oscillator (VCO). A stable input signal is applied to the phase detector which compares the input signal to the output of the voltage controlled oscillator. The output signal of the phase detector is representative of the phase difference between the input signal and the output of the voltage controlled oscillator. The output signal of the phase detector is filtered. The filtered signal is used as an error signal to control the VCO, thereby causing the frequency of the VCO to track the frequency of the stable input signal.

It is well known to those skilled in the art to generate different signals having a carefully determined frequency ($f_{vco}$) using a frequency synthesizer having a PLL 10 as illustrated in FIG. 1. The PLL 10 includes a controllable oscillator (VCO) 14 locked to a crystal source which provides an input signal $f_{xtal}$. The frequency of the VCO signal $f_{vco}$ is typically divided by a controllable divider 15 having a division number N to obtain a signal having a frequency $f_v$. The signal $f_v$ is thereafter compared to the reference signal $f_{ref}$ which is derived from the division of the input signal $f_{xtal}$ from the crystal frequency source by a frequency divider 11 having a division number R. The comparison of the signals having frequencies $f_{ref}$ and $f_v$ in the phase detector 12 generates the control or error signal E. The control signal E is filtered by the filter 13 in order to remove signal components emanating from the signals $F_{ref}$ and $f_v$ respectively. The filtered signal U controls the VCO 14 so that a balance condition is reached ($f_{vco} = f_{xtal} \times N/R$). By choosing different division numbers, N and R respectively, different frequencies can be achieved with a relatively high degree of accuracy.

In this type of frequency synthesizer, the frequency can be changed by selecting the division numbers R and N. After a new frequency has been selected, a certain time is required to achieve balance. This time is determined by the filter 13 among other things. In many implementations it is necessary to achieve quickly a stable output signal $f_{vco}$. Accordingly, the filter 13 has to be designed to have a relatively broad bandwidth.

The bandwidth of the filter 13 in relation to the reference frequency $f_{ref}$ also determine how large a disturbance from $f_{ref}$ and $f_v$ will leak through the VCO 14. Consequently, the filter 13 and the reference frequency $f_{ref}$ also determine the level of disturbances in the VCO output signal $f_{vco}$. The smallest channel spacing has to be equal to or larger than the reference frequency $f_{ref}$. The requirements for a pure signal, therefore, are in conflict with the requirements for a relatively quick lock-in and relatively tight channel spacing.

In addition to the disturbances emanating from the phase detector 12, there are additional disturbances in the signal $f_{vco}$. These disturbances can constitute noise from the VCO 14. For certain frequency bands it can be difficult to design a resonator of the VCO sufficiently inexpensive and small enough to achieve low disturbances and to meet desired performance specifications.

When the synthesizer output signal covers a comparatively broad frequency range, the division of the signal in two or more separate signals having a fixed phase difference (e.g., 90°) becomes difficult. Such phase shifted signals are often required for a vector I/Q modulation.

In the past, attempts have been made to increase the frequency range of frequency synthesizers by adding a frequency multiplier to the output of the voltage controlled oscillator. Swedish Patent No. 441,719 discloses another technique in which the frequency range is increased by using a frequency divider coupled to the output of the VCO. Neither of these two proposed solutions have been able to overcome completely the above-described problems associated with frequency synthesizers.

Accordingly, there is a need for a new improved frequency synthesizer of the phase locked loop type which can achieve quick lock-in combined with low noise/interference levels. The improved frequency synthesizer must be capable of switching reference frequencies without generating phase jumps.

SUMMARY OF THE INVENTION

The present invention provides an improved frequency synthesizer of the PLL type having two frequency divider circuits at the output of the VCO and a switchable reference frequency divider circuit at the input of the phase detector. The improved frequency synthesizer is capable of switching reference frequencies without causing phase jumps. The switchable reference frequency is selected depending upon the desired frequency of the output signal of the frequency synthesizer. The desired output signal is provided by one of the first and second frequency dividers at the output of the PLL. The third frequency divider at the input to the phase-detector divides a signal from a frequency source to provide the frequency synthesizer with a switchable reference frequency. The division numbers of all three frequency dividers are controlled such that a predetermined relationship exists among the three frequency dividers.

DESCRIPTION OF THE PREFERRED EMBODIMENT

Figure 1:
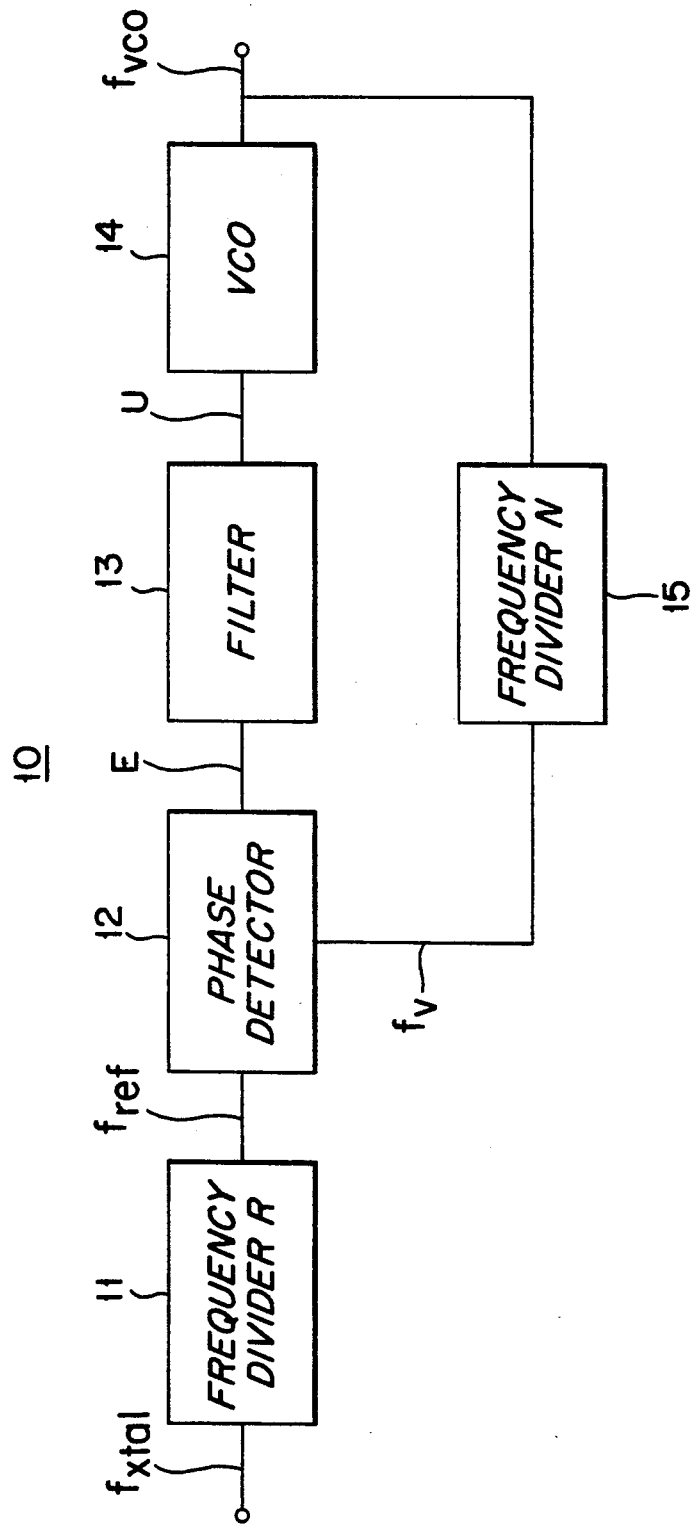
FIG. 1 is a block diagram of a typical prior art phase locked loop.
Figure 2:
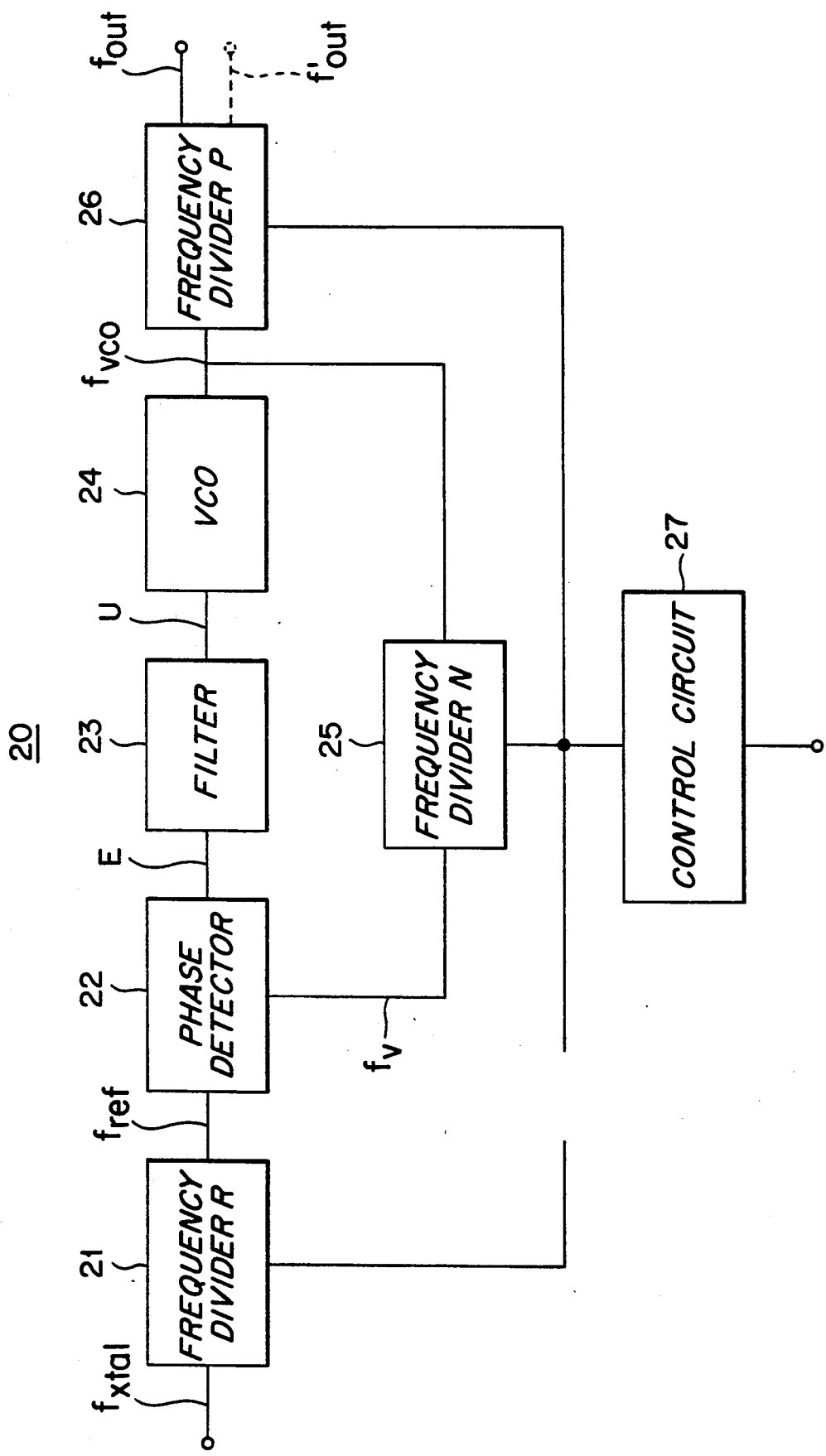
FIG. 2 is a block diagram of the improved frequency synthesizer of the present invention.

Referring now to FIG. 2, a block diagram illustrates the frequency synthesizer 20 of the present invention. The frequency synthesizer 20 is responsive to an input signal $f_{xtal}$ which is generated by a crystal oscillator or other suitable frequency source. The signal $f_{xtal}$ is applied to a frequency divider 21 which divides the signal by the division number R to provide a suitable reference signal $f_{ref}$. The switchable reference signal $f_{ref}$ is applied to a phase detector 22. The output of the phase detector 22 is filtered by a filter 23 and applied to a VCO 24 to generate a signal $f_{vco}$. The signal $f_{vco}$ is applied to a frequency divider 26 which divides the signal by the division number P to provide an output signal $f_{out}$. The signal $f_{vco}$ is also applied to a frequency divider 25 which divides the signal by the division number N to generate a signal $f_v$. The signal $f_v$ is applied to the phase detector 22 where it is compared to the signal $f_{ref}$. The output of the phase detector 22 is an error signal E which is representative of the phase difference between the signals $f_{ref}$ and $f_v$. The error signal E is filtered to provide the filtered signal U used to control the VCO 24. The division numbers R, N, and P of frequency dividers 21, 25, and 26 are controlled by a central unit or control circuit 27.

The three dividers 21, 25, and 26 divide their respective incoming signals with certain numbers R, N, and P. These numbers are determined by the desired frequency of the output signal $f_{out}$, i.e. for a certain output signal $f_{out}$ there are certain values of R, N, and P such that the value of $R \times P$ is always a constant value. The information about the desired output signal $f_{out}$ is input to the control circuit 27 which provides inputs to the dividers 21, 25, and 26. Usually the communication between the control circuit 27 and the dividers is a serial-bus-communication in order to have a small number of transmission lines. The information to the dividers 21, 25 and 26 is an input value to the calculation circuits in each divider which results in the correct division number being calculated by a fixed program in each divider.

The control circuit 27 may be implemented with a suitably programmed microprocessor or controller. The control circuit 27 interprets the channel or frequency setting and generates corresponding division numbers for the frequency dividers 21, 25, 26. The frequency divider 21 having division number R and the frequency divider 25 having division number N may not internally keep track of the phase-state and may have to be enabled so that they do not change ratio and cause phase jumps. Accordingly, the control circuit 27 may obtain phase information from the phase detector 22 in order to generate the enable signal which can be supplied to the dividers 21, 25 and 26. The ratio, therefore, can be changed to avoid phase jumps. Alternatively, the dividers 21, 25 and 26 could be internally enabled to change ratio in a particular phase state (synchronous loading).

The control circuit 27 provides the information signals which are delivered as inputs to the dividers 21, 25, and 26 upon the selection of a desired output signal $f_{out}$ or channel. This information is stored in a first register for divider 21 and in a second register for divider 25. The information to the registers from the control circuit 27 also contains a command which causes the data to be loaded synchronously into the respective register. To avoid undesired phase jumps when changing the dividers 21 and 25 from one value to another, the adjustment of the dividers 21 and 25 can by synchronized by a synchronizing signal from the phase detector 22. Thus, when the phase locked loop is in a locked position, and new division numbers R and N have been provided by the data from the control circuit 27, the phase lock-in process of the loop will start from a zero value of the phase error (i.e. the phase error between $f_{ref}$ and $f_v$). When changing the divisors R and N, an unnecessarily large phase jump is avoided, and the new output frequency is obtained.

The frequency synthesizer 20 generates a signal $f_{vco}$ having a frequency which is considerably higher than that of the desired output signal $f_{out}$. The signal $f_{vco}$ is, therefore, divided down to the desired output frequency $f_{out}$ using the variable divider 26 which can divide by the division number P to a desired value. The disturbances in the signal $f_{vco}$, such as spurious signals and noise, are also divided down to the same extent. It is thereby possible to use a poorer, i.e., less expensive VCO 24, and yet obtain an output fully meeting requirements. Moreover, within certain frequency bands oscillators for high frequencies do not require as large resonators as do corresponding oscillators for lower frequencies. Generating such low frequencies by dividing the output signal $f_{vco}$ down can also provide the benefit of a reduced volume.

In order to get a relatively short lock-in time in a PLL, it is necessary to make it broad banded. Broad banded means that a relatively high disturbance level can occur. The division of the frequency of the signal $f_{vco}$ down to the desired output signal $f_{out}$ in a corresponding way reduces the signal disturbances in relation to the desired signal, and thus the disturbance in the VCO output can be accepted. By using a high frequency in the PLL a simpler filter may be used in the loop. The disadvantage of a high reference frequency (large channel spacing in the VCO signal) is also neutralized by division. The division by the frequency divider 26 causes the frequency channel spacing in the VCO signal $f_{vco}$ to be divided, and the output signal channel spacing can be defined by the equation $f_{ch} = f_{ref}/P$.

Referring again to FIG. 2, it can be appreciated that the desired output signal $f_{out}$ of the synthesizer 20 is generated from the VCO 24 which is operating at a frequency $f_{vco}$. The frequency of signal $f_{vco}$ is P times higher than the frequency output signal $f_{out}$. When changing the frequency of output signal $f_{out}$ the division number P, N and R of dividers 26, 25 and 21 respectively are changed to values which provide the right signal having the desired frequency. Their values are defined by the equation $f_{out} = N \times f_{xtal}/(P \times R)$. Division with the division number P provides the desired channel spacing ($f_{ref}/P$) at the same time as the frequency of reference signal $f_{ref}$ is kept high.

Since the frequency of the reference signal $f_{ref}$ can be kept high in this fashion, the bandwidth of the filter 23 can be increased without the quotient between the reference frequency and the filter bandwidth becoming low. Thereby a comparatively pure signal is received while at the same time the switching to new frequencies is relatively rapid. When the frequency is changed by shifting the division number P of divider 26, the value R of the reference divider 21 is also shifted such that the channel spacing remains unchanged ($P \times R$ = constant) or alternatively becomes at most the desired channel spacing. When changing the division number R, an output is provided such that no phase jumps occur in the reference signal $f_{ref}$ in relation to the signal $f_v$ from the frequency divider 25. When the frequency is changed by changing the division number N of the frequency divider 25, the change should cause no or only minor phase shifts in the signal $f_v$ applied to the phase detector 22 in relation to the reference signal $f_{ref}$. On the other hand, the division number P of divider 26 may be changed without particular restrictions.

The crystal frequency or frequency source is chosen in accordance with the equation $f_{xtal} = f_{ch} \times P \times R$. The signal $f_{vco}$ from the VCO 24 is applied to the divider 26. If the divider 26 is constituted of flip flops with the signal $f_{vco}$ as the clock and having a sufficiently large division number P, the output signal $f_{out}$ can be gated out in two or more different phase positions, e.g. with 90° phase differences (I/Q). The first phase position can be provided by the first output terminal designated $f_{out}$, and the second phase position can be provided by a second output terminal which is illustrated in phantom and designated $f'_{out}$.

Table I illustrates an example of preferable division numbers chosen for a frequency synthesizer for the band 25–112.5 MHz and with a 12 MHz frequency source. The channel spacing equals 25 kHz.

TABLE I

| Desired output frequency $f_{out}$ | $f_{vco}$ | P | N | R |
|---|---|---|---|---|
| 25–37.5 MHz | 600–900 MHz | 24 | 1000–1500 | 20 |
| 37.5–56.25 | 600–900 MHz | 16 | 1500–2250 | 30 |
| 50–75 | 600–900 MHz | 12 | 2000–3000 | 40 |
| 75–112.5 | 600–900 MHz | 8 | 3000–4000 | 60 |

A frequency synthesizer for frequencies in the range of 25 to 112.5 MHz, as illustrated in Table I, may be obtained with the apparatus 20 of FIG. 2. The variable frequency divider 26 having the division number P is controlled by the control circuit 27 to have division numbers 8, 12, 16, and 24. The VCO 24 can then operate within the range of 600 to 900 MHz using a crystal of 12 MHz as the frequency source. In order to get the same channel spacing over the entire range, the reference divider 21 having the division number R is switched such that P×R is unchanged. The division number R changes between the division numbers 60, 40, 30, and 20 to maintain the desired relationship with the division number P of variable frequency divider 26. The division numbers of frequency divider 25 also change correspondingly, and the changing of division numbers R, N and P is controlled by the control circuit 27 as described above.

While the invention has been described in its preferred embodiments, it is to be understood that the words that have been used are words of description rather than of limitation and that changes within the purview of the appended claims may be made without departing from the true scope and spirit of the invention in its broader aspects.

I claim:

1. A signal generator having a selectable frequency which is locked to a reference signal using a phase or frequency locked loop having a controllable oscillator, a detector, a loop filter and a first frequency divider means, wherein the improvement comprises:
    a second frequency divider means for dividing the output of the oscillator; and a third frequency divider means for changing the frequency of the reference signal to a different value depending upon which value has been used to divide the output signal of the oscillator; wherein the output signal of the oscillator is divided into two or more phase positions with constant phase difference by the second frequency divider means.

2. A signal generator having a selectable frequency which is locked to a reference signal using a phase or frequency locked loop having a controllable oscillator, a detector, a loop filter and a first frequency divider means, wherein the improvement comprises:
    a second frequency divider means for dividing the output of the oscillator; and a third frequency dividing means for changing the frequency of the reference signal to a different value depending upon which value has been used to divide the output signal of the oscillator;
    wherein the phase of the reference signal is maintained in relation to the phase of the output signal of the oscillator in order to avoid phase jumps when changing the ratios of said frequency dividing means, and the output signal of the oscillator is divided into two or more phase positions with constant phase difference by the second frequency divider means.

3. A signal generator having a selectable frequency which is locked to a reference signal using a phase or frequency locked loop having a controllable oscillator, a detector, a loop filter and a first frequency divider means, wherein the improvement comprises:
    a second frequency divider means for dividing the output of the oscillator; and a third frequency dividing means for changing the frequency of the reference signal to a different value depending upon which value has been used to divide the output signal to the oscillator;
    wherein the phase of the reference signal is maintained in relation to the phase of the output signal of the oscillator in order to avoid phase jumps when changing the ratios of said frequency dividing means, the division number of the first frequency divider means within the phase locked loop is determined in accordance with the frequency of the reference signal, and the output signal of the oscillator is divided into two or more phase positions with constant phase difference by the second frequency divider means.

4. A method of controlling a frequency synthesizer having a voltage controlled oscillator, a phase detector and a frequency source, which comprises the steps of:
    dividing the output signal of the voltage controlled oscillator by a first value P;
    dividing the output signal of the voltage controlled oscillator by a second value N;
    dividing the input signal from the frequency source by a third value R; and
    controlling the first, second, and third values such that the frequency synthesizer synthesizes a range of predetermined frequencies;
    wherein the first value P and the third value R are maintained such that P×R equals a constant value.

5. A method according to claim 4 further including the step of splitting the output signal into two or more phases by gating out different phase positions from the divider.

6. A method of controlling a frequency synthesizer having a voltage controlled oscillator, a phase detector and a frequency source, which comprises the steps of:
    dividing the output signal of the voltage controlled oscillator by a first value P;
    dividing the output signal of the voltage controlled oscillator by a second value N;
    dividing the input signal from the frequency source by a third value R;
    controlling the first, second, and third values such that the frequency synthesizer synthesizes a range of predetermined frequencies, wherein the phase of the signal divided by the value R is maintained in relation to the phase of the output signal of the voltage controlled oscillator in order to avoid phase jumps when changing the first, second and third values; and splitting the output signal divided by the first value P into two or more phases by gating out different phase positions from a divider.

7. An improved frequency synthesizer of the type having a voltage controlled oscillator, a phase detector and a frequency source which further comprises:
  means for dividing the output signal of the voltage controlled oscillator by a first value P;
  means for dividing the output signal of the voltage controlled oscillator by a second value N;
  means for dividing the input signal from the frequency source by a third value R; and
  means for controlling the first, second and third values such that the frequency synthesizer synthesizes a range of predetermined frequencies;
  wherein said means for controlling includes means for maintaining the values P and R such that $P \times R$ equals a constant value.

8. A frequency synthesizer according to claim 7 wherein output signals from the means for dividing by a value P are phase-shifted with respect to each other.

9. A frequency synthesizer of the type having a voltage controlled oscillator, a phase detector and a frequency source which further comprises:
  means for dividing the output signal of the voltage controlled oscillator by a first value P;
  means for dividing the output signal of the voltage controlled oscillator by a second value N;
  means for dividing the input signal from the frequency source by a third value R; and
  means for controlling the first, second and third values such that the frequency synthesizer synthesizes a range of predetermined frequencies, wherein the phase of the signal divided by the value R is maintained in relation to the phase of the output signal of the voltage controlled oscillator in order to avoid phase jumps when changing the first, second and third values and the output signals from the means for dividing by the first value P are phase-shifted with respect to each other.

* * * * *